(12) United States Patent
Howard et al.

(10) Patent No.: US 7,884,925 B2
(45) Date of Patent: Feb. 8, 2011

(54) ELECTRICAL AND OPTICAL SYSTEM AND METHODS FOR MONITORING EROSION OF ELECTROSTATIC CHUCK EDGE BEAD MATERIALS

(75) Inventors: Bradley J. Howard, Pleasanton, CA (US); Eric Pape, Newark, CA (US); Siwen Li, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 242 days.

(21) Appl. No.: 12/126,625

(22) Filed: May 23, 2008

(65) Prior Publication Data

US 2009/0290145 A1 Nov. 26, 2009

(51) Int. Cl.
*G01J 3/30* (2006.01)
*G01N 27/04* (2006.01)

(52) U.S. Cl. .................. 356/72; 356/316; 324/71.2
(58) Field of Classification Search .......... 356/72
See application file for complete search history.

(56) References Cited

U.S. PATENT DOCUMENTS

| | | | |
|---|---|---|---|
| 5,631,803 | A | 5/1997 | Cameron et al. |
| 5,905,626 | A | 5/1999 | Logan et al. |
| 6,894,769 | B2 * | 5/2005 | Ludviksson et al. ........... 356/72 |
| 7,064,812 | B2 * | 6/2006 | Ludviksson et al. ........... 356/72 |

2009/0061542 A1 * 3/2009 Patrick .................... 438/10

FOREIGN PATENT DOCUMENTS

| | | |
|---|---|---|
| EP | 0742588 A2 | 11/1996 |
| KR | 1020070009159 A | 1/2009 |
| WO | WO-2009143350 A2 | 11/2009 |

OTHER PUBLICATIONS

"International Application Serial No. PCT/US2009/044847, Search Report mailed Jan. 13, 2010", 5 pgs.
"International Application Serial No. PCT/US2009/044847, Written Opinion mailed Jan. 13, 2010", 3 pgs.
"U.S. Appl. No. 12/887,829 Non-Final Office Action mailed Nov. 8, 2010", 6 pgs.

* cited by examiner

*Primary Examiner*—F. L Evans
(74) *Attorney, Agent, or Firm*—Schwegman, Lundberg & Woessner, P.A.

(57) ABSTRACT

A disclosed device comprises an edge bonding seal configured to be mounted to an edge bead of the electrostatic chuck. The edge bonding seal includes a monitoring layer comprised of a first material configured to either emit a species capable of being optically monitored or having an electrical resistance value capable of being monitored, or both. The edge bonding seal further includes an edge bonding layer configured to be interspersed at least between the monitoring layer and the plasma environment. The edge bonding layer is comprised of a second material susceptible to erosion due to reaction with the plasma environment and configured to expose the monitoring layer to the plasma environment upon sufficient exposure to the plasma environment.

14 Claims, 2 Drawing Sheets

US 7,884,925 B2

ELECTRICAL AND OPTICAL SYSTEM AND METHODS FOR MONITORING EROSION OF ELECTROSTATIC CHUCK EDGE BEAD MATERIALS

TECHNICAL FIELD

The present invention relates generally to the field of process equipment used in the semiconductor, data storage, flat panel display, as well as allied or other industries. More particularly, the present invention relates to a system and method to monitor erosion of electrostatic chuck edge bead materials used in plasma-based process tools.

BACKGROUND

Semiconductor device geometries (i.e., integrated circuit design rules) have decreased dramatically in size since integrated circuit (IC) devices were first introduced several decades ago. ICs have generally followed "Moore's Law," which means that the number of devices fabricated on a single integrated circuit chip doubles every two years. Today's IC fabrication facilities are routinely producing 65 nm (0.065 µm) feature size devices, and future fabs will soon be producing devices having even smaller feature sizes.

As IC design rules shrink, an increasing trend in semiconductor manufacturing is utilizing single-wafer processing for a variety of fabrication steps, including plasma etching and deposition chambers. Single-wafer reactors must be designed to unobtrusively secure the wafer (or other substrate-type) during processing, while controlling both temperature and temperature uniformity across the wafer.

Mechanical wafer clamps which engage a portion of front surfaces of the wafer where processing is to be performed potentially create process uniformity problems by interfering with gas flow, altering plasma distribution, and acting as a heat sink. If improperly designed, mechanical wafer clamps may also produce particulates with resulting contamination of the wafer as well as other problems.

An electrostatic chuck (ESC) uses an electrostatic potential to hold a wafer in place during processing, thus avoiding the problems of mechanical clamping by having contact with only the back side of the wafer. Electrostatic chucks operate by inducing opposing charges on the substrate and the chuck thereby resulting in an electrostatic attraction between the chuck and the substrate. A degree of attraction is dependent on an amount of charge induced as well as a rate at which the charge dissipates due to conductive effects. Voltage biasing is employed to induce and control the electrostatic force and may be applied for only a portion of a processing cycle, for example, just after a substrate is transferred to the chuck. Alternatively, voltage biasing may be applied continuously throughout a processing cycle. For instance, using the conduction properties of plasma can provide a means of electrical connection to one terminal of a ESC and wafer system.

With reference to FIG. 1, a portion of an exemplary prior art ESC structure 100 includes an anodized aluminum base 101, a heater bond layer 103, a heater 105, a heater plate 107, and a ceramic bond layer 109. The ESC structure 100 is capped with a ceramic top piece 111. The heater bond layer 103, heater 105, heater plate 107, and ceramic bond layer 109 are protected from direct contact with a surrounding plasma environment and caustic chemicals by an edge bonding seal 113.

The heater bond layer 103 is typically comprised of a silicone layer impregnated with silica (e.g., amorphous $SiO_x$). The heater 105 is frequently comprised of metallic resistance elements encapsulated in a polyimide while the heater plate 107 is typically fabricated from aluminum. A ceramic-filled (e.g., alumina ($Al_2O_3$)) silicone material is commonly employed for the ceramic bond layer 109. The ceramic top piece 111 is commonly fabricated from alumina.

The edge bonding seal 113 may be comprised of, for example, epoxy, silicone, or polyimide based polymers. The edge bonding seal 113 protects the heater 105, the heater plate 107, and the heater 103 and ceramic 109 bonding layers from plasma erosion. However, the edge bonding seal 113, as noted above, is exposed to the plasma and erosion from both chemical reactions and ion bombardment can occur. In addition to the erosion effects, damage caused by factors such as fracturing or delamination may be caused by fast temperature ramps or differences in material coefficients of thermal expansion, since the ESC structure 100 operates over a wide range of temperatures.

Further, direct exposure of bond lines to plasma can result in particle generation, potentially having a deleterious effect on device yields. Erosion of the bond lines prevents future edge bead refurbishment and impacts ultimate part lifetime. Therefore, an indicator mechanism is needed to limit maximum edge bead erosion depths and minimize wafer yield impacts and decrease total tool operating costs.

SUMMARY

In an exemplary embodiment, a device to monitor wear of an electrostatic chuck for use in a plasma environment is disclosed. The device comprises an edge bonding seal configured to be mounted to an edge bead of the electrostatic chuck. The edge bonding seal includes an optical monitoring layer comprised of a first material configured to emit a species capable of being optically monitored and an edge bonding layer configured to be interspersed at least between the monitoring layer and the plasma environment. The edge bonding layer is comprised of a second material susceptible to erosion due to reaction with the plasma environment and configured to expose the monitoring layer to the plasma environment upon sufficient exposure to the plasma environment.

In another exemplary embodiment, a device to monitor wear of an electrostatic chuck for use in a plasma environment is disclosed. The device comprises an edge bonding seal configured to be mounted to an edge bead of the electrostatic chuck. The edge bonding seal includes an electrical monitoring layer comprised of a first material configured to change in resistivity based upon exposure to the plasma environment and an edge bonding layer configured to be interspersed at least between the monitoring layer and the plasma environment. The edge bonding layer is comprised of an electrically non-conductive material susceptible to erosion due to reaction with the plasma environment and configured to expose the monitoring layer to the plasma environment upon sufficient exposure to the plasma environment.

In another exemplary embodiment, a device to monitor wear of an electrostatic chuck for use in a plasma environment is disclosed. The device comprises an edge bonding seal configured to be mounted to an edge bead of the electrostatic chuck. The edge bonding seal includes a monitoring layer comprised of a first material configured to change in resistivity based upon exposure to the plasma environment and to emit a species capable of being optically monitored. The edge bonding seal further includes an edge bonding layer configured to be interspersed at least between the monitoring layer and the plasma environment. The edge bonding layer is comprised of an electrically non-conductive material susceptible to erosion due to reaction with the plasma environment and configured to expose the monitoring layer to the plasma environment upon sufficient exposure to the plasma environment.

In another exemplary embodiment, a method to monitor plasma-induced erosion near an edge bead of an electrostatic chuck is disclosed. The method comprises placing an edge bonding seal containing an optical monitoring layer in proximity to the edge bead, measuring a baseline level of volatile species present near the electrostatic chuck using an optical system, using the optical system to detect volatile species emitted from the optical monitoring layer, and continuing to detect emitted volatile species to evaluate a level of erosion of the optical monitoring layer.

In another exemplary embodiment, a method to monitor plasma-induced erosion near an edge bead of an electrostatic chuck is disclosed. The method comprises placing an edge bonding seal containing an electrical monitoring layer in proximity to the edge bead, measuring a baseline level of electrical resistance of the electrical monitoring layer, and continuing to measure differences in resistance to evaluate level of erosion of the electrical monitoring layer.

BRIEF DESCRIPTION OF THE DRAWINGS

The appended drawings merely illustrate exemplary embodiments of the present invention and must not be considered as limiting its scope.

DETAILED DESCRIPTION

Various embodiments discussed below disclose a means to monitor when an edge bonding seal within an ESC is eroded, thus protecting the heater and other bonding layers. The various embodiments disclose a monitoring belt or layer in the edge bead of an ESC with either an independent erosion indicator or an indicator combined with various optical and electrical monitoring instrumentation. When the monitoring layer is exposed to plasma, it reacts with the plasma species producing volatile chemicals which can be detected by, for example, an optical emission spectroscopy (OES) system.

In other embodiments, a change in the monitoring layer may be detected by a simple reflectivity or optical scattering system. Designs for these and related optical measurement systems are known in the art.

Alternatively, since the plasma erosion reaction changes a measured electrical resistance of the conducting layer, the resistance of the monitoring layer may be measured. In yet another alternative embodiment, current from plasma to ground is monitored through a conducting or semiconducting circumferential layer and a base of the ESC.

Figure 1:
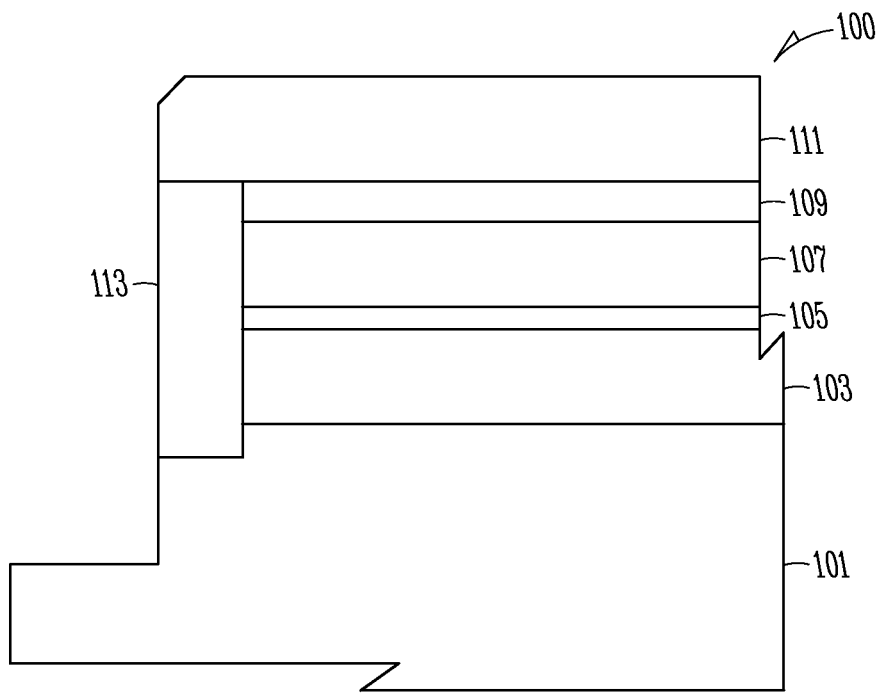
FIG. 1 is a cross-sectional view of a portion of a prior art electrostatic chuck.
Figure 2:
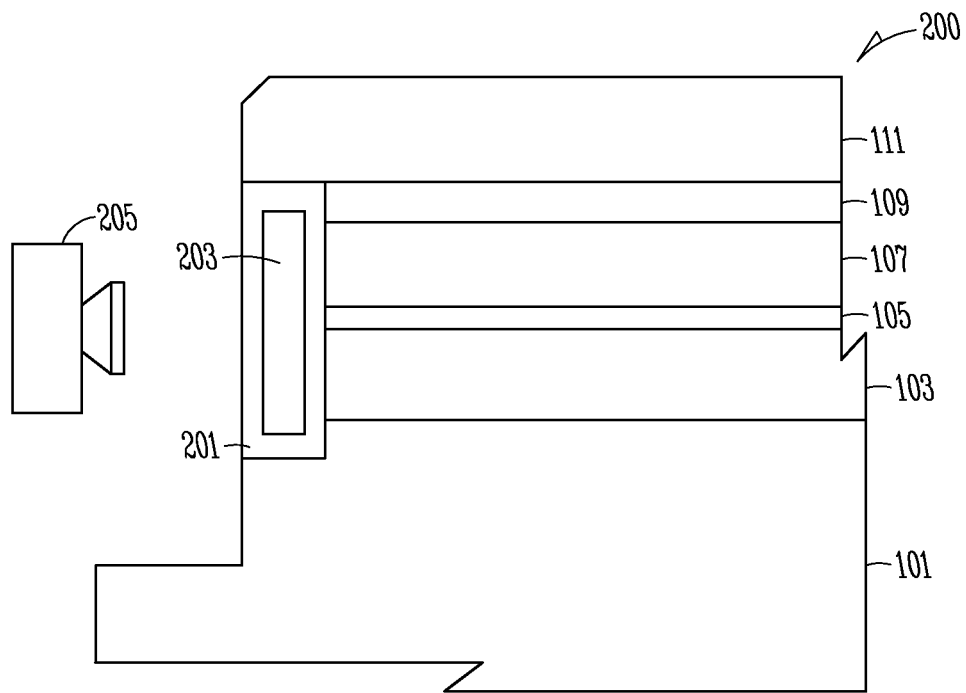
FIG. 2 is a cross-sectional view of an electrostatic chuck having an edge bonding seal incorporating an indicator mechanism in accord with an exemplary embodiment of the present invention.

With reference to FIG. 2, a portion of an exemplary ESC structure 200 includes an edge bonding layer 201 and an optical monitoring layer 203. The edge bonding layer 201 and optical monitoring layer 203 may be used with any standard ESC structure, thus replacing the edge bonding seal 113 (FIG. 1).

The optical monitoring layer 203 is placed in the edge bead of the exemplary ESC structure 200 and sandwiched by bonding materials in the edge bonding layer 201. Relative and absolute radial positioning, as shown in FIG. 2, is determined according to bonding layer design and materials properties. Such design criteria are known to one of skill in the art for a given set of materials.

Functionally, when an outer layer of bonding materials in the edge bonding layer 201 is eroded by plasma, the optical monitoring layer 203 will be directly exposed to the plasma environment and either optical or electrical signals, as noted above, will be altered. These signals may be monitored to indicate ESC replacement times. In some cases, the edge bead of a removed ESC may then be refurbished to extend the ultimate part lifetime, thus reducing cost-of-ownership of the tool.

In a specific exemplary embodiment, the monitoring function of the optical monitoring layer 203 makes use of optical emission or changes in other optical characteristics. In this case, the optical monitoring layer 203 contains specific elements which are configured to form specific volatile species or compounds. The specific species or compounds possess wavelength and intensity signatures distinct from other signals produced by process species in the plasma. Therefore, the specific element in the optical monitoring layer 203 either does not exist in the input gases, hardware parts, or wafer films. Alternatively, the element is in a low enough concentration in the gases, parts, or films to provide a reasonable monitoring result when emitted from the optical monitoring layer 203.

Some possible elements that may be used for monitoring of the optical monitoring layer 203 include, for example, phosphorus (P) and sulfur (S). Phosphorus-containing species produce strong emission signatures at 214 nm and 253 nm as well as at other wavelengths monitored by an in-chamber OES system 205 or other optical monitoring device known independently in the art. Sulfur produces strong emission signatures with bands tightly centered at 364 nm, 374 nm, and 384 nm.

In a specific exemplary embodiment, the optical monitoring layer 203 is formed from polymeric or elastomeric materials containing P or S. These particular materials, among others, have good mechanical properties in terms of modulus of elasticity, coefficient of thermal expansion, and bonding strength. Some appropriate phosphorus containing polymers may be polyphosphazenes including, for example, poly (dichlorophosphazene) and poly(bis(phenoxy)phosphazene). These polymers are soluble in common organic solvents and can easily be made into films that may be applied as a sandwiched monitoring belt.

Figure 3:
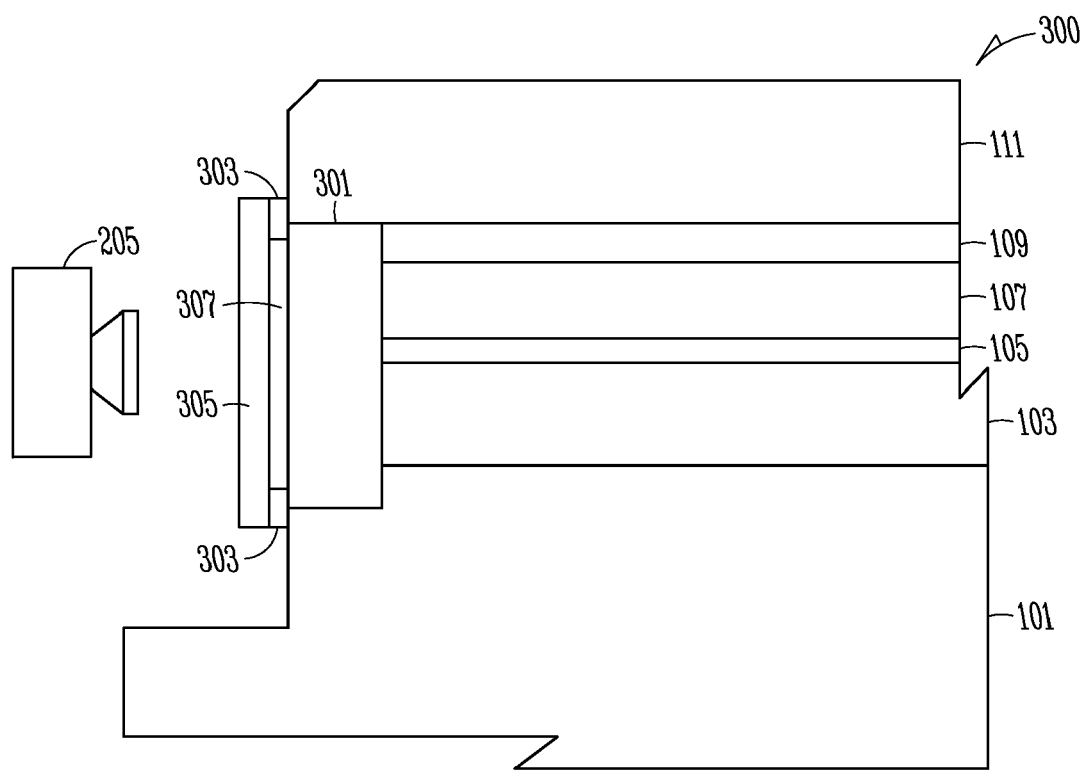
FIG. 3 is a cross-sectional view of an electrostatic chuck having an edge bonding seal incorporating an indicator mechanism in accord with another exemplary embodiment of the present invention.

Referring now to FIG. 3, a portion of an alternative exemplary ESC structure 300 includes an edge bonding layer 301, an edge bonding spacer layer 303, an edge bonding cover layer 305, and an optical monitoring layer 307. The edge bonding layer 301, edge bonding spacer layer 303, and edge bonding cover layer 305 may all be comprised of the same material. Alternatively, they may each be formed of different materials provided they meet the proper mechanical and chemical requirements as noted above and that they further may be properly bonded, one to another. The optical monitoring layer 307 in FIG. 3 may be fabricated, for example, with P or S elements as noted above, and may be placed as indicated to increase an amount of volatile P- or S-containing species present in plasma gases to increase feasibility of OES detection by, for example, the in-chamber OES system 205. The larger potential surface area of the optical monitoring layer 307 thus provides a larger signal-to-noise ratio in this configuration as compared with the optical monitoring layer 203 (FIG. 2).

Industries using phosphorus-containing films or sulfur-containing gases for etching processes may expect difficulty identifying specific emission signatures related solely to edge bead erosion. However, several methods may be used to circumvent the additional presence of monitoring elements other than in the edge bead. For example, chronologically measuring and comparing wafer-to-wafer differences in emission signatures, measuring emission during both process and clean (when a wafer is not present in the process chamber), and using an array of tracer materials where at least one is not present in the process chamber except in the ESC edge monitoring layer. Moreover, forming the monitoring layer from conducting materials offers either an alternative or a supplemental monitoring procedure to optical measurements.

Figure 4:
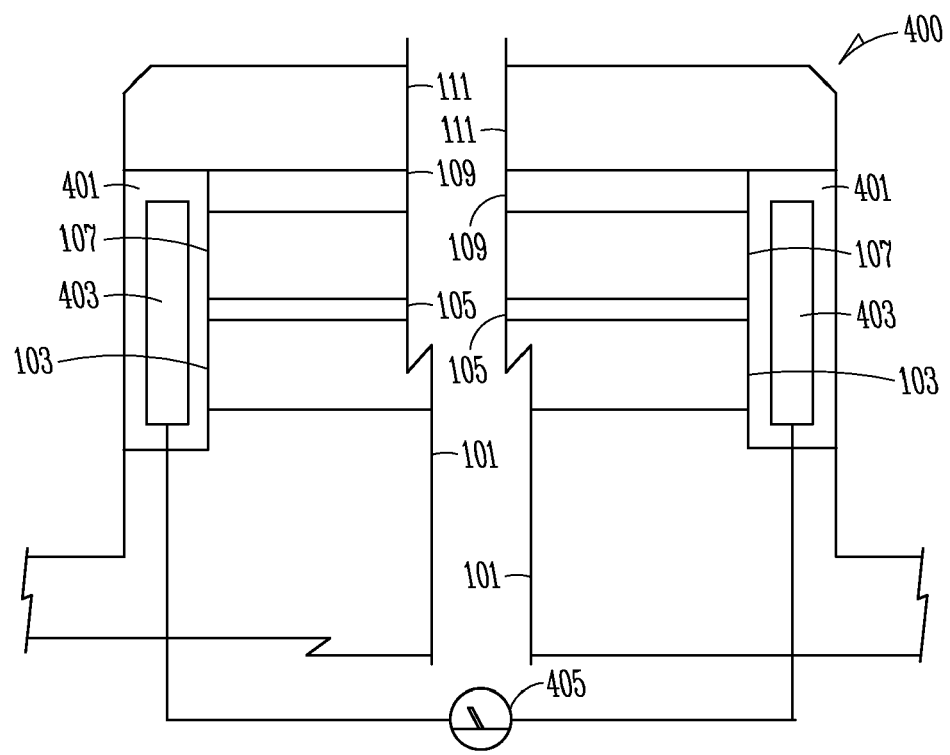
FIG. 4 is a cross-sectional view of an electrostatic chuck having an edge bonding seal incorporating an indicator mechanism in accord with yet another exemplary embodiment of the present invention.

In FIG. 4, a portion of an alternative exemplary ESC structure 400 includes an edge bonding layer 401 and an electrical monitoring layer 403. In this embodiment, the edge bonding layer 401 is either electrically non-conductive or has low electrical conductivity. The electrical monitoring layer 403 forms an open circle, and its electrical resistance is measured by, for example, an ohmmeter 405. A skilled artisan will recognize that the ohmmeter 405 may be replaced by a Kelvin sensing device, a four-point probe, or other type of device known in the art for measuring a change in resistance or conductivity.

As the electrical monitoring layer 403 is exposed to plasma, the conducting materials contained therein react with plasma species, and the electrical resistance of the electrical monitoring layer 403 typically increases quickly because of the decrease of dimension in the electrical monitoring layer 403. When the electrical monitoring layer 403 is broken because of the plasma reaction and ionic bombardments, the electrical circuit which was effectively formed becomes open.

In a specific exemplary embodiment, conducting materials used to fabricate the electrical monitoring layer 403 are plasma sensitive and reactive with the plasma species. Resulting reaction products with the plasma gas species are therefore volatile. Such conducting materials include, for example, silicon (Si), silicon carbide (SiC), silicon nitride ($Si_3N_4$), various boron-containing materials (e.g., boron nitride (both hexagonal, h-BN, and cubic, C—BN)), as well as other elemental and compound semiconductor-containing materials. These materials can be fabricated in various thicknesses, one example being from 1 micron to 20 microns. The materials may be applied to edge bonding layer 401 by methods known in the art including, for example, chemical vapor deposition (CVD), physical vapor deposition (PVD), and other common film deposition and formation techniques. The edge bonding layer 401 may be comprised of, for example, various polymers sandwiching the electrical monitoring layer 403. For example, materials such as silicone, epoxy, and polyimide are all plasma-tolerant and may be appropriate for different plasma processing environments.

Conducting films can also be formed from conducting polymers that reduce potential problems with cracking from thermal expansion. These materials, usually composed of aromatic rings, include, but are not limited to, polyacetylene, polyparaphenylene, polypyrrole, polyaniline, polyperinaphthalene, and poly(phenylenesuldephenyleneamine) (PPSA).

In a further exemplary embodiment (not shown), an alternative electrical monitoring approach uses a sandwiched conductive layer similar to that of FIG. 4 in the edge bead material stack. The conductive layer is electrically contacting the ESC baseplate (as an example, the base plate is formed from aluminum). Direct current conducted from the plasma through the base plate (at a controlled voltage relative to plasma or ground) may be monitored over time. The conducted direct current changes as protective layers erode thus increasing resistance in the electrical monitoring layer.

The present invention is described above with reference to specific embodiments thereof. It will, however, be evident to a skilled artisan that various modifications and changes can be made thereto without departing from the broader spirit and scope of the present invention as set forth in the appended claims.

For example, particular embodiments describe a number of material types and layers employed. A skilled artisan will recognize that these materials and layers may be varied and those shown herein are for exemplary purposes only in order to illustrate the novel nature of the edge band monitor. Additionally, a skilled artisan will further recognize that the techniques and methods described herein may be applied to any sort of structure operating in a harsh plasma and chemical environment. The application to an electrostatic chuck of the semiconductor industry is purely used as an exemplar to aid one of skill in the art in describing various embodiments of the present invention.

Further, a skilled artisan will recognize, upon a review of the information disclosed herein, that the edge band monitor embodiments may be used in an analog as well as a binary (i.e., go/no-go gauge) form. For example, as the monitoring layer wears, resistance increases and may be monitored. The ESC structure may be reworked only after the resistance approaches a given level. Similar schemes may be employed on embodiments utilizing optical monitoring while watching for, for example, changes in reflectivity. Further, although the optical and electrical monitoring embodiments are shown separately, they may be combined as well to operate in a variety of different etch and deposition environments.

Moreover, the term semiconductor should be construed throughout the description to include data storage, flat panel display, as well as allied or other industries. These and various other embodiments are all within a scope of the present invention. The specification and drawings are, accordingly, to be regarded in an illustrative rather than a restrictive sense.

What is claimed is:

1. A device to monitor wear of an electrostatic chuck for use in a plasma environment, the device comprising:
    an edge bonding seal configured to be mounted to an edge bead of the electrostatic chuck, the edge bonding seal including
        an electrical monitoring layer comprised of a first material configured to change in resistivity based upon exposure to the plasma environment; and
        an edge bonding layer configured to be interspersed at least between the electrical monitoring layer and the plasma environment, the edge bonding layer being comprised of an electrically non-conductive material susceptible to erosion due to reaction with the plasma environment and configured to expose the electrical monitoring layer to the plasma environment upon sufficient exposure to the plasma environment.

2. The device of claim 1 further comprising an electrical monitoring device coupled to the electrical monitoring layer.

3. The device of claim 1 wherein the first material is a conductive polymer.

4. The device of claim 1 further comprising interspersing a portion of the edge bonding layer between the edge bead of the electrostatic chuck and the electrical monitoring layer.

5. The device of claim 1 wherein a combined resistance value of the electrical monitoring layer and the electrostatic chuck is configured to change based upon exposure to the plasma environment.

6. The device of claim 1 further comprising a current measuring device configured to measure a difference in direct current conducted from the plasma to a base plate of the electrostatic chuck.

7. A device to monitor wear of an electrostatic chuck for use in a plasma environment, the device comprising:
   an edge bonding seal configured to be mounted to an edge bead of the electrostatic chuck, the edge bonding seal including
      a monitoring layer comprised of a first material configured to change in resistivity based upon exposure to the plasma environment and to emit a species capable of being optically monitored; and
      an edge bonding layer configured to be interspersed at least between the monitoring layer and the plasma environment, the edge bonding layer being comprised of an electrically non-conductive material susceptible to erosion due to reaction with the plasma environment and configured to expose the monitoring layer to the plasma environment upon sufficient exposure to the plasma environment.

8. The device of claim 7 further comprising an electrical monitoring device coupled to the monitoring layer.

9. The device of claim 7 wherein the first material is a conductive polymer.

10. The device of claim 7 further comprising interspersing a portion of the edge bonding layer between the edge bead of the electrostatic chuck and the monitoring layer.

11. The device of claim 7 wherein a combined resistance value of the monitoring layer and the electrostatic chuck is configured to change based upon exposure to the plasma environment.

12. The device of claim 7 further comprising a current measuring device configured to measure a difference in direct current conducted from the plasma to a base plate of the electrostatic chuck.

13. The device of claim 7 further comprising an optical monitoring device arranged to detect the emitted species from the monitoring layer.

14. A method of monitoring plasma-induced erosion near an edge bead of an electrostatic chuck, the method comprising:
   placing an edge bonding seal containing an electrical monitoring layer in proximity to the edge bead;
   measuring a baseline level of electrical resistance of the electrical monitoring layer; and
   continuing to measure differences in resistance to evaluate level of erosion of the electrical monitoring layer.

* * * * *